（12）United States Patent
Hara et al.

(10) Patent No.: US 10,985,035 B2
(45) Date of Patent: Apr. 20, 2021

(54) SUBSTRATE LIQUID PROCESSING APPARATUS, SUBSTRATE LIQUID PROCESSING METHOD AND COMPUTER READABLE RECORDING MEDIUM HAVING SUBSTRATE LIQUID PROCESSING PROGRAM RECORDED THEREIN

(71) Applicant: Tokyo Electron Limited, Tokyo (JP)

(72) Inventors: Hiromi Hara, Kumamoto (JP);
Hideaki Sato, Kumamoto (JP);
Takahiro Kawazu, Kumamoto (JP);
Takashi Nagai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 320 days.

(21) Appl. No.: 14/608,718

(22) Filed: Jan. 29, 2015

(65) Prior Publication Data

US 2015/0221530 A1 Aug. 6, 2015

(30) Foreign Application Priority Data

Jan. 31, 2014 (JP) .............................. JP2014-017524

(51) Int. Cl.
*H01L 21/67* (2006.01)
*B08B 3/08* (2006.01)
*H01L 21/02* (2006.01)

(52) U.S. Cl.
CPC .......... *H01L 21/67023* (2013.01); *B08B 3/08* (2013.01); *H01L 21/02052* (2013.01);
(Continued)

(58) Field of Classification Search
CPC ................. B08B 3/08; H01L 21/02052; H01L 21/67017; H01L 21/67023;
(Continued)

(56) References Cited

U.S. PATENT DOCUMENTS 5,188,701 A * 2/1993 Hirano .............. H01L 21/67086
438/5
5,308,400 A * 5/1994 Chen ................. H01L 21/02052
134/2
(Continued)

FOREIGN PATENT DOCUMENTS

JP H07-230981 A 8/1995
JP 2010-074060 A 4/2010
(Continued)

OTHER PUBLICATIONS

Machine translation of JP2013-232593A dated Nov. 2013.*

*Primary Examiner* — Douglas Lee
(74) *Attorney, Agent, or Firm* — Abelman, Frayne & Schwab

(57) ABSTRACT

Disclosed is a method for performing a liquid processing on a substrate using an aqueous solution of a chemical agent at a predetermined concentration as a processing liquid. The method includes: storing the processing liquid in a processing liquid storage unit; and supplying an aqueous solution of the chemical agent at a different concentration from the concentration of the processing liquid to the processing liquid storage unit, discharging the processing liquid from the processing liquid storage unit so as to update the processing liquid stored in the processing liquid storage unit. The aqueous solution in a predetermined amount is supplied to the processing liquid storage unit, and the processing liquid is discharged from the processing liquid storage unit, the processing liquid containing the chemical agent in the same amount as the amount of the chemical agent contained in the aqueous solution supplied to the processing liquid storage unit.

11 Claims, 4 Drawing Sheets

(52) U.S. Cl.
CPC .. *H01L 21/67017* (2013.01); *H01L 21/67028* (2013.01); *H01L 21/67057* (2013.01); *H01L 21/67086* (2013.01)

(58) Field of Classification Search
CPC ......... H01L 21/67028; H01L 21/67057; H01L 21/67086
See application file for complete search history.

(56) References Cited

U.S. PATENT DOCUMENTS

| | | | | |
|---|---|---|---|---|
| 5,722,441 | A * | 3/1998 | Teramoto | B08B 3/10 134/56 R |
| 6,699,400 | B1 * | 3/2004 | Ballantine | H01L 21/31111 216/90 |
| 2002/0001967 | A1 * | 1/2002 | Yokomizo | H01L 21/67086 438/745 |
| 2006/0157197 | A1 * | 7/2006 | Maegawa | H01L 21/67086 156/345.18 |
| 2009/0081881 | A1 * | 3/2009 | Kiyose | H01L 21/67086 438/753 |

FOREIGN PATENT DOCUMENTS

| | | | | |
|---|---|---|---|---|
| JP | 2013-232593 A | | 11/2013 | |
| JP | 2013232593 A | * | 11/2013 | ........ H01L 21/31111 |

* cited by examiner

SUBSTRATE LIQUID PROCESSING APPARATUS, SUBSTRATE LIQUID PROCESSING METHOD AND COMPUTER READABLE RECORDING MEDIUM HAVING SUBSTRATE LIQUID PROCESSING PROGRAM RECORDED THEREIN

CROSS-REFERENCE TO RELATED APPLICATIONS

This application is based on and claims priority from Japanese Patent Application No. 2014-017524, filed on Jan. 31, 2014, with the Japan Patent Office, the disclosure of which is incorporated herein in its entirety by reference.

TECHNICAL FIELD

The present disclosure relates to a substrate liquid processing apparatus, a substrate liquid processing method and a computer readable recording medium having a substrate liquid processing program recorded therein, in which a liquid processing is performed on substrates using an aqueous solution of a chemical agent at a predetermined concentration as a processing liquid.

BACKGROUND

In manufacturing, for example, semiconductor parts or a flat panel display, a substrate liquid processing apparatus has conventionally been used for performing a processing such as etching or cleaning on substrates such as, for example, semiconductor wafers or liquid crystal substrates using a processing liquid such as, for example, an etching liquid or a cleaning liquid.

In the substrate liquid processing apparatus, an aqueous solution of a chemical agent at a predetermined concentration is used as a processing liquid. The substrates are processed with the processing liquid by being immersed in a processing bath which stores the processing liquid or ejecting the processing liquid from a processing liquid storage bath toward the surfaces of the substrates.

In a conventional substrate liquid processing apparatus, when the substrates are repeatedly processed by the processing liquid, the concentration of, for example, impurities increases, the impurities being included in the processing liquid by the processing of the substrates. Thus, the substrates may not be satisfactorily processed. For example, when the substrates are processed by a phosphoric acid aqueous solution (an etching liquid), the capability (etching rate) of the processing liquid depends on the silicon concentration in the processing liquid. Thus, the silicon concentration in the processing liquid needs to be maintained in a predetermined range. However, the repetition of the processing of the substrates increases the silicon concentration in the etching liquid and decreases the capability of the processing liquid. Thus, the substrates may not be satisfactorily etched (See, e.g., Japanese Patent Laid-Open Publication No. 2010-74060).

Accordingly, in the conventional substrate liquid processing apparatus, an exchange of the processing liquid is periodically performed such that all of the stored processing liquid is wasted, and a new processing liquid is fully replenished. Especially, when the substrates are etched, the concentration of silicon contained in the processing liquid needs to be maintained in a predetermined range. Thus, after a total amount of the processing liquid is exchanged, dummy substrates are immersed in the processing liquid to adjust the concentration of silicon contained in the processing liquid.

SUMMARY

The present disclosure provides an apparatus for performing a liquid processing on a substrate using an aqueous solution of a chemical agent at a predetermined concentration as a processing liquid. The apparatus includes: a processing liquid storage unit configured to store the processing liquid; an aqueous solution supply unit configured to supply an aqueous solution of the chemical agent at a different concentration from the concentration of the processing liquid to the processing liquid storage unit; a processing liquid discharging unit configured to discharge the processing liquid from the processing liquid storage unit; and a control unit configured to control the aqueous solution supply unit and the processing liquid discharging unit. The control unit controls the aqueous solution supply unit to supply the aqueous solution in a predetermined amount to the processing liquid storage unit, and the processing liquid discharging unit to discharge the processing liquid from the processing liquid storage unit, the processing liquid containing the chemical agent in the same amount as the amount of the chemical agent contained in the aqueous solution supplied to the processing liquid storage unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
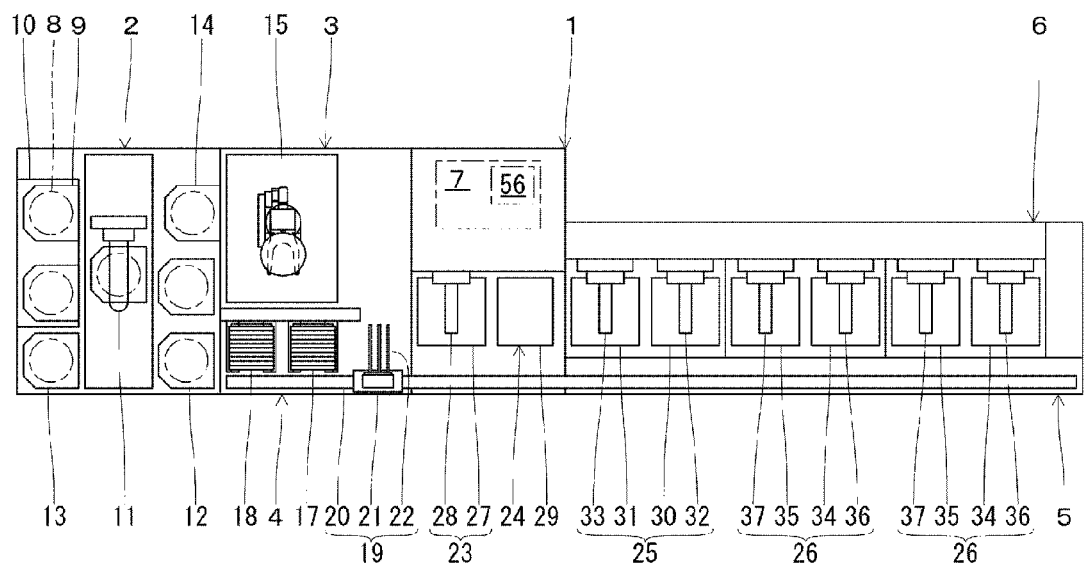
FIG. 1 is an explanatory plan view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate liquid processing apparatus, a total amount of the processing liquid is exchanged and dummy substrates are immersed in the processing liquid so as to adjust the concentration of silicon contained in the processing liquid. Thus, a time required for exchange of the processing liquid may be increased, and a throughput of the substrate liquid processing apparatus may be reduced.

In order to reduce a time required for the exchange of the processing liquid, a method of updating the processing liquid may be considered in which a part (a predetermined amount) of the processing liquid is wasted, and a new processing liquid in the same amount is replenished.

However, in a case where the concentration needs to be adjusted as in a phosphoric acid aqueous solution used as for the etching liquid, an aqueous solution of a chemical agent at a predetermined concentration is heated up to a predetermined temperature so as to produce a processing liquid at a different concentration from the concentration of the aqueous solution. Accordingly, when the aqueous solution is replenished in the same amount as that of the wasted processing liquid, the concentration of the processing liquid may be changed. Thus, the substrates may not be satisfactorily processed.

An aspect of the present disclosure is to provide an apparatus for performing a liquid processing on a substrate using an aqueous solution of a chemical agent at a predetermined concentration as a processing liquid. The apparatus includes: a processing liquid storage unit configured to store the processing liquid; an aqueous solution supply unit configured to supply an aqueous solution of the chemical agent at a different concentration from the concentration of the processing liquid to the processing liquid storage unit; a processing liquid discharging unit configured to discharge the processing liquid from the processing liquid storage unit; and a control unit configured to control the aqueous solution supply unit and the processing liquid discharging unit. The control unit controls the aqueous solution supply unit to supply the aqueous solution in a predetermined amount to the processing liquid storage unit, and the processing liquid discharging unit to discharge the processing liquid from the processing liquid storage unit, the processing liquid containing the chemical agent in the same amount as the amount of the chemical agent contained in the aqueous solution supplied to the processing liquid storage unit.

The aqueous solution has a lower concentration and a lower temperature than the processing liquid. The apparatus further includes a heating unit configured to heat the aqueous solution after the aqueous solution is supplied to the processing liquid storage unit.

The apparatus further includes a water supply unit configured to supply water to the processing liquid storage unit. The control unit performs a control such that water is supplied from the water supply unit to the processing liquid storage unit in an amount obtained by subtracting an amount of water contained in the aqueous solution supplied to the processing liquid storage unit from a total of an amount of water evaporated from the processing liquid storage unit by heating and an amount of water contained in the processing liquid discharged from the processing liquid storage unit.

The control unit performs a control such that the substrate is immersed in the processing liquid stored in the processing liquid storage unit to be processed by the processing liquid. Supply of the aqueous solution by the aqueous solution supply unit and discharge of the processing liquid by the processing liquid discharging unit are performed at once while the substrate is processed.

The control unit memorizes a water level of the processing liquid storage unit after the substrate is immersed in the processing liquid storage unit, and controls an amount of the processing liquid discharged from the processing liquid storage unit by the processing liquid discharging unit so as to maintain the water level.

Another aspect of the present disclosure is to provide a method for performing a liquid processing on a substrate using an aqueous solution of a chemical agent at a predetermined concentration as a processing liquid. The method includes storing the processing liquid in a processing liquid storage unit; supplying an aqueous solution of the chemical agent at a different concentration from the concentration of the processing liquid to the processing liquid storage unit; and discharging the processing liquid from the processing liquid storage unit, thereby updating the processing liquid stored in the processing liquid storage unit. The aqueous solution in a predetermined amount is supplied to the processing liquid storage unit, and the processing liquid is discharged from the processing liquid storage unit, the processing liquid containing the chemical agent in the same amount as the amount of the chemical agent contained in the aqueous solution supplied to the processing liquid storage unit.

The aqueous solution has a lower concentration and a lower temperature than the processing liquid, and the aqueous solution is heated after supplied to the processing liquid storage unit.

Water is supplied to the processing liquid storage unit in an amount obtained by subtracting an amount of water contained in the aqueous solution supplied to the processing liquid storage unit from a total of an amount of water evaporated from the processing liquid storage unit by heating and an amount of water contained in the processing liquid discharged from the processing liquid storage unit.

The substrate is immersed in the processing liquid stored in the processing liquid storage unit to be processed by the processing liquid, and supply of the aqueous solution and discharge of the processing liquid are performed at once while the substrate is processed.

A water level of the processing liquid storage unit is memorized after the substrate is immersed in the processing liquid storage unit, and the processing liquid is discharged from the processing liquid storage unit so as to maintain the water level.

A further aspect of the present disclosure is to provide a computer readable recording medium in which a substrate liquid processing program is recorded, the medium being configured to control a substrate liquid processing apparatus. The substrate liquid processing apparatus includes: a processing liquid storage unit configured to store an aqueous solution of a chemical agent at a predetermined concentration as a processing liquid used for a liquid processing on a substrate; an aqueous solution supply unit configured to supply an aqueous solution of the chemical agent at a different concentration from the concentration of the processing liquid to the processing liquid storage unit; and a processing liquid discharging unit configured to discharge the processing liquid from the processing liquid storage unit. The aqueous solution in a predetermined amount is supplied to the processing liquid storage unit by the aqueous solution supply unit, and the processing liquid is discharged from the processing liquid storage unit by the processing liquid discharging unit, the processing liquid containing the chemical agent in the same amount as the amount of the chemical agent contained in the aqueous solution supplied to the processing liquid storage unit.

In the present disclosure, a processing liquid may be quickly updated without changing the concentration of the processing liquid. Thus, a liquid processing of substrates may be satisfactory performed without reducing the throughput of the substrate liquid processing apparatus.

Hereinafter, descriptions will be made on specific configurations of the substrate liquid processing apparatus, the substrate liquid processing method and the substrate liquid processing program according to the present disclosure with reference to drawings.

As illustrated in FIG. 1, a substrate liquid processing apparatus 1 includes a carrier carry-in/out unit 2, a lot forming unit 3, a lot mounting unit 4, a lot conveyance unit 5, a lot processing unit 6, and a control unit 7.

The carrier carry-in/out unit 2 carries carriers 9 into or out of the carrier carry-in/out unit 2. Each of the carriers 9 accommodates a plurality (e.g., twenty five sheets) of substrates 8 which is in a horizontal posture to be aligned vertically.

The carrier carry-in/out unit 2 is provided with a carrier stage 10 on which a plurality of carriers 9 is mounted, a carrier conveyance mechanism 11 configured to convey the carriers 9, carrier stocks 12 and 13 configured to temporarily store the carriers 9, and a carrier mounting unit 14 on which the carriers 9 are mounted. Here, the carrier stock 12 temporarily stores the substrates 8 which will be products before the substrates 8 are processed in the lot processing unit 6. The carrier stock 13 temporarily stores the substrates 8 which will be products after the substrates 8 are processed in the lot processing unit 6.

The carrier carry-in/out unit 2 conveys the carrier 9 carried into the carrier stage 10 from the outside, to the carrier stock 12 or the carrier mounting unit 14 by using the carrier conveyance mechanism 11. The carrier carry-in/out unit 2 conveys the carrier 9 mounted on the carrier mounting unit 14 to the carrier stock 13 or the carrier stage 10 by using the carrier conveyance mechanism 11. The carrier 9 conveyed to the carrier stage 10 is carried to the outside.

The lot forming unit 3 forms a lot by combining the substrates 8 accommodated within one or more carriers 9 with each other. One lot consists of a plurality (e.g., fifty sheets) of substrates 8 to be processed at once.

The lot forming unit 3 is provided with a substrate conveyance mechanism 15 configured to convey the plurality of substrates 8. The substrate conveyance mechanism 15 may change the posture of the substrates 8 from a horizontal posture to a vertical posture and from a vertical posture to a horizontal posture during the conveyance of the substrates 8.

The lot forming unit 3 conveys the substrates 8 from the carrier 9 mounted on the carrier mounting unit 14 to the lot mounting unit 4 by using the substrate conveyance mechanism 15 and forms a lot in the lot mounting unit 4. The lot forming unit 3 conveys the lot mounted on the lot mounting unit 4 into the carrier 9 mounted on the carrier mounting unit 14 by using the substrate conveyance mechanism 15. The substrate conveyance mechanism 15 includes two kinds of substrate supports configured to support the plurality of substrates 8. One is a non-processed substrate support configured to support the substrates 8 before the substrates 8 are processed (conveyed by the lot conveyance unit 5), and the other is a processed substrate support configured to support the substrates 8 after the substrates 8 are processed (conveyed by the lot conveyance unit 5). Accordingly, for example, particles attached on the non-processed substrates 8 are suppressed from being transferred to, for example, the processed substrates 8.

In the lot mounting unit 4, lots which are conveyed between the lot forming unit 3 and the lot processing unit 6 by the lot conveyance unit 5 are temporarily mounted (on standby).

The lot mounting unit 4 includes a carry-in side lot mounting unit 17 on which a non-processed lot is mounted before the lot is conveyed by the lot conveyance unit 5, and a carry-out side lot mounting unit 18 on which a processed lot is mounted after the lot is conveyed by the lot conveyance unit 5. Lots each of which includes the plurality of substrates 8 in a vertical posture are mounted on the carry-in side lot mounting unit 17 and the carry-out side lot mounting unit 18 to be aligned in the front-rear direction.

In the lot mounting unit 4, the lot formed in the lot forming unit 3 is mounted on the carry-in side lot mounting unit 17, and is carried into the lot processing unit 6 through the lot conveyance unit 5. In the lot mounting unit 4, the lot carried out of the lot processing unit 6 through the lot conveyance unit 5 is mounted on the carry-out side lot mounting unit 18 and is conveyed to the lot forming unit 3.

The lot conveyance unit 5 conveys lots between the lot mounting unit 4 and the lot processing unit 6 or within the lot processing unit 6.

The lot conveyance unit 5 is provided with a lot conveyance mechanism 19 configured to convey lots. The lot conveyance mechanism 19 includes a rail 20 disposed along the lot mounting unit 4 and the lot processing unit 6, and a moving body 21 which holds the plurality of substrates 8 and moves along the rail 20. A substrate holder 22 is provided in the moving body 21 to be capable of advancing and retreating. The substrate holder 22 is configured to hold the plurality of substrates 8 arranged in the vertical posture in the front-rear direction.

The lot conveyance unit 5 receives a lot mounted on the carry-in side lot mounting unit 17 by the substrate holder 22 of the lot conveyance mechanism 19, and delivers the received lot to the lot processing unit 6. The lot conveyance unit 5 receives the lot processed in the lot processing unit 6 by the substrate holder 22 of the lot conveyance mechanism 19, and delivers the received lot to the carry-out side lot mounting unit 18. The lot conveyance unit 5 conveys the lot within the lot processing unit 6 by using the lot conveyance mechanism 19.

The lot processing unit 6 performs processings such as etching, cleaning or drying, on one lot including the plurality of substrates 8 arranged in the vertical posture in the front-rear direction.

The lot processing unit 6 includes a drying device 23 configured to dry the substrates 8, a substrate hold cleaning device 24 configured to clean the substrate holder 22, a cleaning device 25 configured to clean the substrates 8, and two etching apparatuses 26 configured to etch the substrates 8, which are provided to be aligned.

The drying device 23 includes a substrate elevating mechanism 28 which is provided in a processing bath 27 to be capable of elevating. A drying processing gas such as, for example, isopropyl alcohol (IPA) for drying the substrates 8 is supplied to the processing bath 27. One lot including the plurality of substrates 8 in a vertical posture is held to be aligned in the front-rear direction in the substrate elevating mechanism 28. The drying device 23 receives a lot from the substrate holder 22 of the lot conveyance mechanism 19 by the substrate elevating mechanism 28, and elevates the lot by the substrate elevating mechanism 28 so that the drying processing gas of the processing bath 27 is supplied to the lot to dry the substrates 8. The drying device 23 delivers the lot from the substrate elevating mechanism 28 to the substrate holder 22 of the lot conveyance mechanism 19.

The substrate hold cleaning device 24 is configured to supply a cleaning processing liquid and a drying gas to a processing bath 29. The substrate hold cleaning device 24 supplies the cleaning processing liquid to the substrate holder 22 of the lot conveyance mechanism 19 and then supplies the drying gas to clean the substrate holder 22.

The cleaning device 25 includes a cleaning processing bath 30 and a rinse processing bath 31, and substrate elevating mechanisms 32 and 33 are provided in the processing baths 30 and 31, respectively to be capable of elevating. A cleaning processing liquid such as SC-1 for cleaning the substrates 8 is stored in the cleaning processing bath 30. A rinse processing liquid such as pure water for rinsing the substrates 8 is stored in the rinse processing bath 31.

Each of the etching apparatuses 26 includes an etching processing bath 34 and a rinse processing bath 35, and substrate elevating mechanisms 36 and 37 are provided in the processing baths 34 and 35, respectively to be capable of elevating. An etching processing liquid such as a phosphoric acid aqueous solution for etching the substrates 8 is stored in the etching processing bath 34. A rinse processing liquid such as pure water for rinsing the substrates 8 is stored in the rinse processing bath 35.

The cleaning device 25 and the etching apparatus 26 have the same configuration. Descriptions will be made on the etching apparatus 26. One lot including the plurality of substrates 8 is held in each of the substrate elevating mechanisms 36 and 37 to be aligned in the vertical posture in the front-rear direction. The etching apparatus 26 receives a lot from the substrate holder 22 of the lot conveyance mechanism 19 by the substrate elevating mechanism 36 and elevates the received lot by the substrate elevating mechanism 36 so that the lot is immersed in the etching processing liquid in the processing bath 34 to etch the substrates 8. Then, the etching apparatus 26 delivers the lot from the substrate elevating mechanism 36 to the substrate holder 22 of the lot conveyance mechanism 19. The etching apparatus 26 receives the lot from the substrate holder 22 of the lot conveyance mechanism 19 by the substrate elevating mechanism 37 and elevates the received lot by the substrate elevating mechanism 37 so that the lot is immersed in the rinse processing liquid in the processing bath 35 to rinse the substrates 8. Then, the etching apparatus 26 delivers the lot from the substrate elevating mechanism 37 to the substrate holder 22 of the lot conveyance mechanism 19.

In the etching apparatus 26, an aqueous solution of a chemical agent (phosphoric acid) at a predetermined concentration (88.3 wt % of a phosphoric acid aqueous solution) is used as a processing liquid (an etching liquid) to perform a liquid processing (an etching processing) on the substrates 8.

Figure 2:
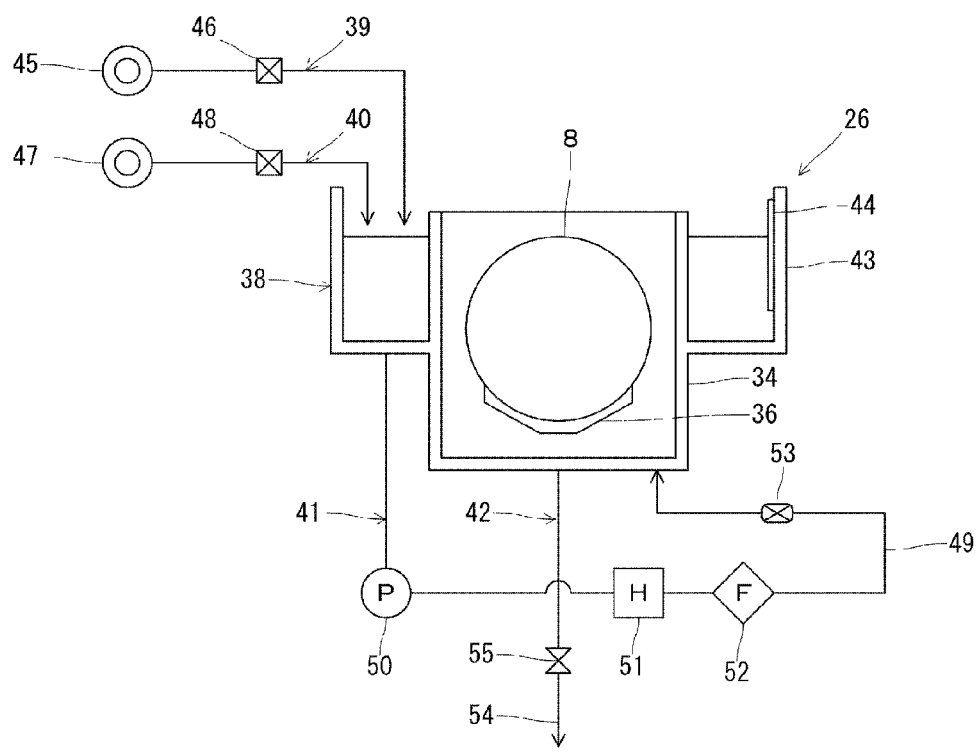
FIG. 2 is an explanatory view illustrating an etching apparatus.

The etching apparatus 26, as illustrated in FIG. 2, includes: a processing liquid storage unit 38 configured to store the processing liquid and to process the substrates 8, the processing liquid consisting of a phosphoric acid aqueous solution at a predetermined concentration (88.3 wt % of a phosphoric acid aqueous solution); an aqueous solution supply unit 39 configured to supply an aqueous solution of a chemical agent (phosphoric acid) (85 wt % of a phosphoric acid aqueous solution) at a different concentration from the processing liquid to the processing liquid storage unit 38; a water supply unit 40 configured to supply water (pure water) to the processing liquid storage unit 38; a processing liquid circulating unit 41 configured to circulate the processing liquid stored in the processing liquid storage unit 38; and a processing liquid discharging unit 42 configured to discharge the processing liquid from the processing liquid storage unit 38.

The processing liquid storage unit 38 includes an outer bath 43 with a top opening and stores the processing liquid in the processing bath 34 and the outer bath 43. The outer bath 43 is formed at the periphery of the upper portion of the processing bath 34 with a top opening. The processing bath 34 stores the processing liquid in which the substrates 8 are immersed by the substrate elevating mechanism 36 and subjected to a liquid processing. The outer bath 43 stores the processing liquid overflowing from the processing bath 34, the aqueous solution supplied from the aqueous solution supply unit 39, or the water supplied from the water supply unit 40, and supplies the processing liquid to the processing bath 34 by the processing liquid circulating unit 41. A water level sensor 44 is provided in the outer bath 43 to detect the water level of the processing liquid. The water level sensor 44 is connected to the control unit 7.

In the aqueous solution supply unit 39, an aqueous solution supply source 45 is connected to the outer bath 43 of the processing liquid storage unit 38 via a flow regulator 46 to supply the phosphoric acid aqueous solution at a predetermined concentration (85 wt %) at a predetermined temperature (25° C.). The flow regulator 46 is connected to the control unit 7, and its opening/closing and flow rate are controlled by the control unit 7.

In the water supply unit 40, a water supply source 47 is connected to the outer bath 43 of the processing liquid storage unit 38 via a flow regulator 48 to supply the pure water at a predetermined temperature (25° C.). The flow regulator 48 is connected to the control unit 7, and its opening/closing and flow rate are controlled by the control unit 7.

In the processing liquid circulating unit 41, a circulation path 49 is formed between a bottom of the outer bath 43 of the processing liquid storage unit 38 and a bottom of the processing bath 34. A pump 50, a heater (heating unit) 51, a filter 52, and a concentration sensor 53 configured to detect the concentration of a phosphoric acid aqueous solution are sequentially provided in the circulation path 49. The pump 50, the heater 51, the filter 52, and the concentration sensor 53 are connected to the control unit 7. The processing liquid circulating unit 41 drives the pump 50 to circulate the processing liquid from the outer bath 43 to the processing bath 34. At that time, the processing liquid is heated up to a predetermined temperature (165° C.) by the heater 51.

In the processing liquid discharging unit 42, an external drain 54 is connected to the bottom of the processing bath 34 of the processing liquid storage unit 38 via an open/close valve 55. The open/close valve 55 is connected to the control unit 7, and is opened and closed by the control unit 7.

The etching apparatus 26 causes the aqueous solution supply unit 39 to supply a phosphoric acid aqueous solution at a predetermined concentration (85 wt %) and predetermined temperature (25° C.) to the processing liquid storage unit 38, and causes the processing liquid circulating unit 41 to heat the supplied solution up to a predetermined concentration (88.3 wt %) and a predetermined temperature (165° C.) to generate a processing liquid so that the generated processing liquid is stored in the processing liquid storage unit 38. The etching apparatus 26 causes the water supply unit 40 to supply pure water in an amount corresponding to the amount of water evaporated by heating to the processing liquid storage unit 38. Accordingly, the etching apparatus 26 stores the processing liquid at a predetermined concentration (88.3 wt %) and a predetermined temperature (165° C.) in the processing bath 34 of the processing liquid storage unit 38 and immerses the substrates 8 in the processing liquid by the substrate elevating mechanism 36 so as to etch the substrates 8.

The etching apparatus 26 discharges a part (or all) of the processing liquid in the processing liquid storage unit 38 by the processing liquid discharging unit 42 and newly supplies an aqueous solution by the aqueous solution supply unit 39 so as to properly update (exchange) the processing liquid stored in the processing liquid storage unit 38.

The control unit 7 controls operations of the respective units of the substrate liquid processing apparatus 1 (for example, the carrier carry-in/out unit 2, the lot forming unit 3, the lot mounting unit 4, the lot conveyance unit 5, and the lot processing unit 6).

The control unit 7 is, for example, a computer, and is provided with a computer-readable recording medium 56. In the recording medium 56, a program is stored to control various processings to be executed in the substrate liquid processing apparatus 1. The control unit 7 reads out and executes the program recorded in the recording medium 56 to control the operation of the substrate liquid processing apparatus 1. The program is recorded in the computer-readable recording medium 56, and may be installed to the recording medium 56 of the control unit 7 from another recording medium. Examples of the computer-readable recording medium 56 may include a hard disk (HD), a flexible disk (FD), a compact disk (CD), a magneto-optical disk (MO), and a memory card.

The substrate liquid processing apparatus 1 is configured as described above. The control unit 7 controls the operations of the respective units (for example, the carrier carry-in/out unit 2, the lot forming unit 3, the lot mounting unit 4, the lot conveyance unit 5, and the lot processing unit 6) to process the substrates 8.

Figure 3:
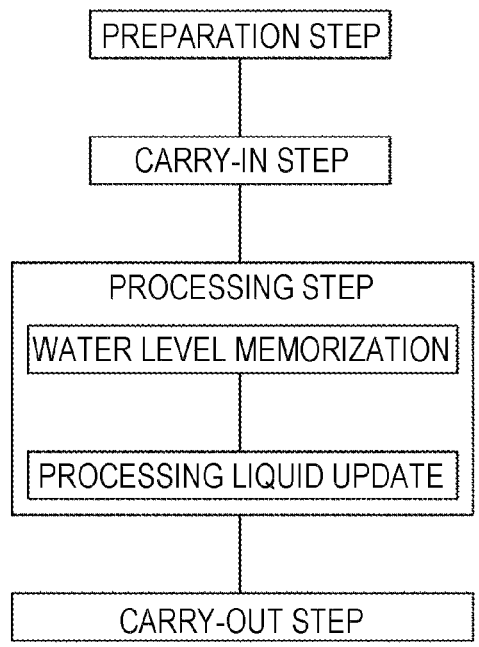
FIG. 3 is a flow chart illustrating a substrate liquid processing program.
Figure 4:
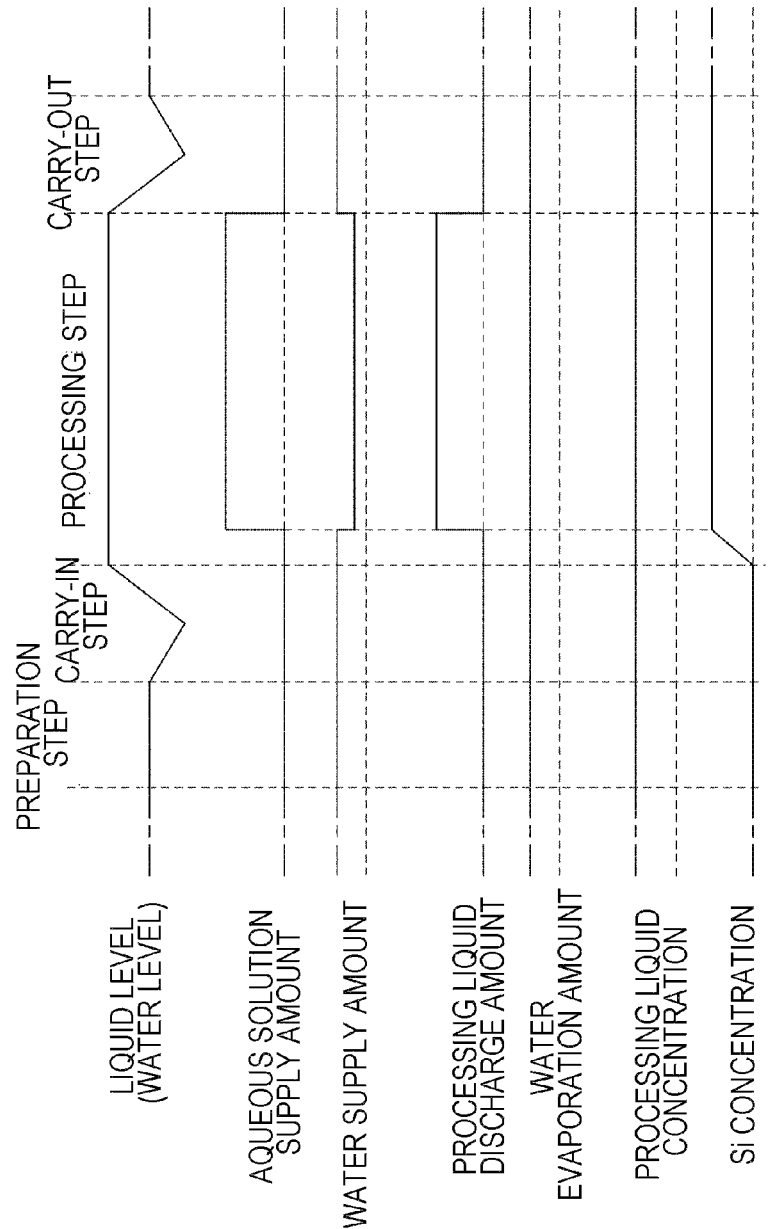
FIG. 4 is a time chart of the substrate liquid processing program.

When the substrates 8 are etched by the substrate liquid processing apparatus 1, the control unit 7 controls, for example, the etching apparatus 26 according to the substrate liquid processing program recorded in the recording medium 56, as described below (see FIGS. 3 and 4).

First, the substrate liquid processing apparatus 1 makes preparations for etching the substrates 8 (a preparation step).

In the preparation step, the control unit 7 circulates and heats the processing liquid stored in the processing liquid storage unit 38 by the processing liquid circulating unit 41. Accordingly, a processing liquid at a predetermined concentration (88.3 wt %) and a predetermined temperature (165° C.) is generated. The processing liquid is stored in the processing bath 34 of the processing liquid storage unit 38 and overflows from the processing bath 34 to the outer bath 43, while heated by the processing liquid circulating unit 41 to be maintained at a predetermined temperature (165° C.). In this manner, when the processing liquid (a phosphoric acid aqueous solution) is heated up to a temperature equal to or greater than a boiling point of water, moisture contained in the processing liquid is evaporated to increase the concentration of phosphoric acid contained in the processing liquid. Therefore, the control unit 7 supplies pure water in an amount corresponding to the amount of water evaporated by heating to the processing liquid storage unit 38 by the water supply unit 40. Accordingly, the processing liquid stored in the processing bath 34 of the processing liquid storage unit 38 is maintained at a predetermined concentration (88.3 wt %) and a predetermined temperature (165° C.). For example, when the amount of water evaporated by heating is 100 ml/min, the same amount of pure water is supplied from the water supply unit 40 to the processing liquid storage unit 38. The heating of the processing liquid is continuously performed in the subsequent steps (a carry-in step, a processing step, a carry-out step).

Then, the substrate liquid processing apparatus 1 carries the substrates 8 to be etched therein (a carry-in step).

In the carry-in step, the control unit 7 raises the substrate elevating mechanism 36 from the inside of the processing bath 34. Then, one lot including the substrates 8 which will be processed at once is carried from the lot conveyance mechanism 19 to the substrate elevating mechanism 36. Then, the substrate elevating mechanism 36 holding the substrates 8 is lowered into the interior of the processing bath 34. Accordingly, the substrates 8 are immersed in the processing liquid stored in the processing bath 34. The water level of the processing liquid stored in the processing liquid storage unit 38 is lowered once according to raising of the substrate elevating mechanism 36, and is raised according to lowering of the substrate elevating mechanism 36 holding the substrates 8.

When the substrates 8 are immersed in the processing liquid, etching of the substrates 8 is initiated (a processing step). When the substrates 8 are etched by the processing liquid, the concentration of silicon contained in the processing liquid is increased. The capability (etching rate) of the processing liquid depends on the silicon concentration of the processing liquid, and thus the silicon concentration of the processing liquid needs to be maintained in a predetermined concentration range. Therefore, in the substrate liquid processing apparatus 1, as described below, a part of the processing liquid is discharged during the processing of the substrates 8, and a new processing liquid is replenished to perform update of the processing liquid.

At the initiation of etching, the control unit 7 detects and memorizes the liquid level (water level) of the processing liquid stored in the processing liquid storage unit 38 by the water level sensor 44 (water level memorization). Then, the control unit 7 newly supplies a phosphoric acid aqueous solution at a predetermined concentration (85 wt %) and a predetermined temperature (25° C.) to the processing liquid storage unit 38 by the aqueous solution supply unit 39, and discharges the processing liquid in a predetermined amount from the processing liquid storage unit 38 by the processing liquid discharging unit 42 (processing liquid update). The update of the processing liquid may be initiated when a predetermined time has elapsed from the initiation of the etching, or when the silicon concentration of the processing liquid becomes equal to or higher than a predetermined value.

Here, in the substrate liquid processing apparatus 1, 500 ml/min of a processing liquid is newly replenished from the aqueous solution supply unit 39. The newly replenished aqueous solution is 85 wt % of a phosphoric acid aqueous solution. Accordingly, when the processing liquid at a different concentration from that of the aqueous solution is discharged in the same amount as that of the aqueous solution, the concentration of the processing liquid stored in the processing liquid storage unit 38 is changed. In the substrate liquid processing apparatus 1, the concentration (85 wt %) of the supplied aqueous solution is lower than the concentration (88.3 wt %) of the discharged processing liquid. Thus, when the discharge amount and the supply amount are the same, the concentration of the processing liquid is reduced.

Therefore, the control unit 7 causes the aqueous solution supply unit 39 to supply a phosphoric acid aqueous solution in a predetermined amount to the processing liquid storage unit 38, and causes the processing liquid discharging unit 42 to discharge the processing liquid containing the chemical agent in the same amount as that of the chemical agent (phosphoric acid) contained in the phosphoric acid aqueous solution supplied to the processing liquid storage unit 38, from the processing liquid storage unit 38. For example, when 500 ml/min of a 85 wt % phosphoric acid aqueous solution is newly replenished from the aqueous solution supply unit 39 to the processing liquid storage unit 38, 500 ml/min of the supplied phosphoric acid aqueous solution contains 384.6 ml/min of phosphoric acid. 436.6 ml/min of the processing liquid as a 88.3 wt % processing liquid which contains the same amount of phosphoric acid as that of the aqueous solution is discharged from the processing liquid storage unit 38. Accordingly, the amount of the chemical agent contained in the processing liquid in the stored processing liquid storage unit 38 may be always constantly maintained.

In the substrate liquid processing apparatus 1, the temperature (25° C.) of the aqueous solution supplied to the processing liquid storage unit 38 is lower than the temperature (165° C.) of the processing liquid stored in the processing liquid storage unit 38, and the processing liquid is heated up to a temperature equal to or greater than the boiling point of water by the processing liquid circulating unit 41. Accordingly, in the substrate liquid processing apparatus 1, a predetermined amount of moisture is evaporated from the processing liquid storage unit 38. In a case where the amount of water evaporated by heating is 100 ml/min, when pure water is supplied in the same amount from the water supply unit 40 to the processing liquid storage unit 38 during update of the processing liquid, the concentration of the processing liquid is reduced because the concentration (85 wt %) of the supplied aqueous solution is lower than the concentration (88.3 wt %) of the discharged processing liquid.

Therefore, the control unit 7 supplies pure water from the water supply unit 40 to the processing liquid storage unit 38 in an amount obtained by subtracting an amount of water contained in the phosphoric acid aqueous solution supplied to the processing liquid storage unit 38 from the sum of an amount of water evaporated from the processing liquid storage unit 38 by heating and an amount of water contained in the processing liquid discharged from the processing liquid storage unit 38. For example, as described above, in a case where 500 ml/min of a 85 wt % phosphoric acid aqueous solution is newly replenished from the aqueous solution supply unit 39 to the processing liquid storage unit 38, and 436.6 ml/min of the 88.3 wt % processing liquid which contains the same amount of phosphoric acid as that of the supplied phosphoric acid aqueous solution is discharged from the processing liquid storage unit 38, when the amount of water evaporated from the processing liquid storage unit 38 by heating is 100 ml/min, the amount of water contained in the 88.3 wt % processing liquid discharged from the processing liquid storage unit 38 is 52 ml/min, and the amount of water contained in the phosphoric acid aqueous solution supplied to the processing liquid storage unit 38 is 115.4 ml/min. Accordingly, the total of 100 ml/min (the amount of water evaporated from the processing liquid storage unit 38 by heating) and 52 ml/min (the amount of water contained in the processing liquid discharged from the processing liquid storage unit 38) is 152 ml/min. The amount of water obtained by subtracting 115.4 ml/min (the amount of water contained in the phosphoric acid aqueous solution supplied to the processing liquid storage unit 38) from 152 ml/min is 36.6 ml/min. The pure water is supplied from the water supply unit 40 to the processing liquid storage unit 38 in the same amount as 36.6 ml/min. Accordingly, the amount of pure water contained in the processing liquid stored in the processing liquid storage unit 38 may be always constantly maintained.

As described above, in the substrate liquid processing apparatus 1, the amounts of the chemical agent (phosphoric acid) and the pure water contained in the processing liquid stored in the processing liquid storage unit 38 may be always constantly maintained, and the concentration and amount of the processing liquid may be constantly maintained. Accordingly, the etching of the substrates 8 may be satisfactorily performed.

In the substrate liquid processing apparatus 1, the amount of the processing liquid stored in the processing liquid storage unit 38 is constantly maintained. Thus, even when the amount of the processing liquid discharged from the processing liquid discharging unit 42 is not accurately controlled by using, for example, a flow controller, the processing liquid discharging unit 42 may be controlled to maintain the liquid level (water level) of the processing liquid which is memorized at the initiation of etching. Accordingly, the cost for the substrate liquid processing apparatus 1 may be reduced.

After the etching is performed for a predetermined time, the substrate liquid processing apparatus 1 carries the etched substrates 8 out of the substrate liquid processing apparatus 1 (a carry-out step).

In the carry-out step, the control unit 7 raises the substrate elevating mechanism 36 holding the substrates 8 from the inside of the processing bath 34. Accordingly, the etching of the substrates 8 is finished. Then, the substrates 8 of one lot, which have been processed at once, are conveyed from the substrate elevating mechanism 36 to the lot conveyance mechanism 19. Then, the substrate elevating mechanism 36 is lowered to the interior of the processing bath 34.

As described above, the substrate liquid processing apparatus 1 supplies an aqueous solution at a different concentration from that of a processing liquid in a predetermined amount to the processing liquid storage unit 38, and discharges the processing liquid containing the chemical agent in the same amount as that of the chemical agent contained in the aqueous solution supplied to the processing liquid storage unit 38, from the processing liquid storage unit 38 so as to perform update of the processing liquid. Thus, the processing liquid may be quickly updated without changing the concentration of the processing liquid. Then, the liquid processing of the substrates 8 may be satisfactorily performed without reducing the throughput of the substrate liquid processing apparatus 1.

Figure 5:
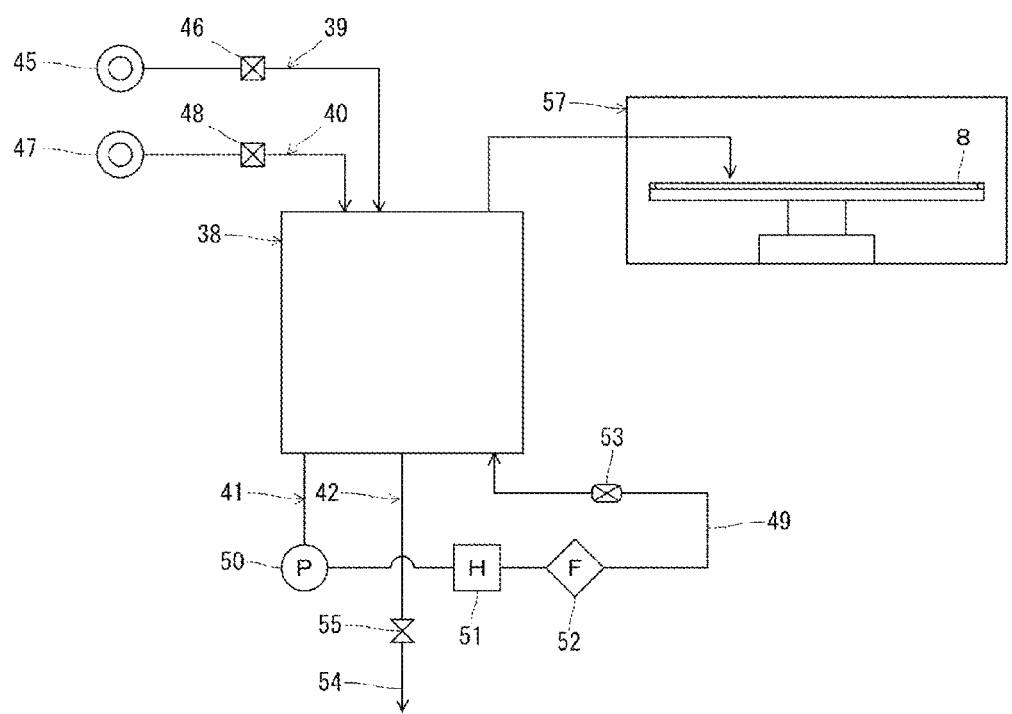
FIG. 5 is an explanatory view illustrating another etching apparatus.

In the substrate liquid processing apparatus 1, the present disclosure is applied to a case where the liquid processing is performed on the substrates 8 in the processing liquid storage unit 38. However, for example, as illustrated in FIG. 5, the present disclosure may also be applied to a case where a processing liquid is supplied to a separate substrate processing unit 57 from a storage tank serving as the processing liquid storage unit 38, and the substrates 8 are subjected to a liquid processing in the substrate processing unit 57. The present disclosure is not limited to the case where the phosphoric acid aqueous solution is used as the processing liquid, but may be applied to a case where another type of aqueous solution or a mixed solution of a plurality of types of aqueous solutions is used. Further, the present disclosure is not limited to the etching, but may also be applied to, for example, cleaning.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for performing a liquid processing on a substrate, the apparatus comprising:
a processing liquid having a first predetermined concentration of phosphoric acid;

a processing liquid storage configured to store the processing liquid;

an aqueous solution having a second predetermined concentration of phosphoric acid lower than the first predetermined concentration of the phosphoric acid in the processing liquid;

an aqueous solution supply source configured to supply the aqueous solution to the processing liquid storage;

a processing liquid discharge pipe and valve configured to discharge the processing liquid from the processing liquid storage; and a controller programmed to:
 as a first step, supply a predetermined amount of the aqueous solution from the aqueous solution supply source to the processing liquid storage, and
 as a second step, discharge an amount of the processing liquid from the processing liquid storage through the processing liquid discharge pipe and valve, in response to an amount of the phosphoric acid in the aqueous solution supplied in the first step, such that an amount of the phosphoric acid in the discharged processing liquid is the same as the amount of the phosphoric acid supplied in the first step via the aqueous solution, and
 wherein the amount of the processing liquid discharged from the processing liquid storage in the second step is less than the predetermined amount of the aqueous solution supplied to the processing liquid storage in the first step.

2. The apparatus of claim 1, wherein the aqueous solution in the aqueous solution supply source has a lower temperature than the processing liquid in the processing liquid storage, wherein the apparatus further comprises a heater in a circulation path around the processing liquid storage, and
wherein the controller is further programmed to:
 as a third step, control the heater to heat the processing liquid while it is being circulated.

3. The apparatus of claim 2, further comprising a water supply source configured to supply water to the processing liquid storage, wherein the controller is further programmed to:
 as a fourth step, supply water from the water supply source to the processing liquid storage in an amount equal to the sum of: (a) an amount of water contained in the processing liquid that was discharged from the processing liquid storage in the second step, plus (b) an amount of water evaporated from the processing liquid storage, minus (c) an amount of water contained in the aqueous solution supplied to the processing liquid storage in the first step.

4. The apparatus of claim 1, wherein the controller is further programmed to immerse the substrate in the processing liquid stored in the processing liquid storage while simultaneously performing the first step and the second step.

5. The apparatus of claim 4, wherein the controller is further programmed to:
 store to a memory a water level of the processing liquid storage after the substrate is immersed in the processing liquid storage, and
 control the amount of the processing liquid discharged from the processing liquid storage by the processing liquid discharge pipe and valve in the second step, so as to maintain the water level.

6. A method for performing a liquid processing on a substrate comprising:

as a first step, storing a processing liquid in a processing liquid storage having a predetermined concentration of phosphoric acid;

as a second step, supplying to the processing liquid storage an amount of an aqueous solution having a predetermined concentration of phosphoric acid lower than the predetermined concentration of the phosphoric acid in the processing liquid; and as a third step, discharging an amount of the processing liquid and silicon contained in the from the processing liquid storage via a processing liquid discharge pipe and valve, wherein the amount of the phosphoric acid in the processing liquid discharged from the processing liquid storage via the processing liquid discharge pipe and valve in the third step is in response to an amount of the phosphoric acid supplied by the aqueous solution supplied in the second step, such that an amount of the phosphoric acid in the discharged processing liquid is the same as the amount of the phosphoric acid contained within the aqueous solution supplied in the second step, and wherein the amount of the processing liquid discharged from the processing liquid storage in the third step is less than the predetermined amount of the aqueous solution supplied to the processing liquid storage in the second step.

7. The method of claim 6, wherein the aqueous solution has a lower temperature than the processing liquid, and the method further comprises a fourth step to control a heater in a circulation path around the processing liquid storage, to heat the aqueous solution while it is being circulated.

8. The method of claim 7, further comprising a fifth step of supplying water to the processing liquid storage in an amount equal to the sum of: (a) an amount of water contained in the processing liquid that was discharged from the processing liquid storage in the third step, plus (b) an amount of water evaporated from the processing liquid storage, minus (c) an amount of water contained in the aqueous solution supplied to the processing liquid storage in the second step.

9. The method of claim 6, further comprising immersing the substrate in the processing liquid stored in the processing liquid storage while simultaneously performing the second step and the third step.

10. The method of claim 9, further comprising storing to a memory a water level of the processing liquid storage after the substrate is immersed in the processing liquid storage, and controlling the amount of the processing liquid discharged from the processing liquid storage by the processing liquid discharge pipe and valve in the third step, so as to maintain the water level.

11. A computer readable recording medium in which a substrate liquid processing program is recorded, the medium being configured, when executed on a controller, to control a substrate liquid processing apparatus to:

as a first step, store in a processing liquid storage a processing liquid having a predetermined concentration of phosphoric acid;

as a second step, supply to the processing liquid storage an amount of an aqueous solution having a predetermined concentration of the phosphoric acid lower than the predetermined concentration of the phosphoric acid in the processing liquid; and as a third step, discharge an amount of the processing liquid and silicon contained in the processing liquid from the processing liquid storage via a processing liquid discharge pipe and valve, wherein the amount of the phosphoric acid in the processing liquid discharged from the processing liquid storage via the processing liquid discharge pipe and valve in the third step is in response to an amount of the phosphoric acid supplied by the aqueous solution supplied in the second step, such that an amount of the phosphoric acid in the discharged processing liquid is the same as the amount of the phosphoric acid contained within the aqueous solution supplied in the second step, and wherein the amount of the processing liquid discharged from the processing liquid storage in the third step is less than the predetermined amount of the aqueous solution supplied to the processing liquid storage in the second step.

\* \* \* \* \*